US006835672B1

(12) United States Patent
Park et al.

(10) Patent No.: US 6,835,672 B1
(45) Date of Patent: Dec. 28, 2004

(54) SELECTIVE OXIDATION FOR SEMICONDUCTOR DEVICE FABRICATION

(75) Inventors: Song C. Park, Plano, TX (US); Takayuki Niuya, Plano, TX (US); Boyang Lin, Richardson, TX (US); Ming Hwang, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/173,129

(22) Filed: Oct. 15, 1998

(51) Int. Cl.⁷ .............................................. H01L 21/31
(52) U.S. Cl. ...................................... 438/770; 438/787
(58) Field of Search ................................. 438/770–772, 438/787–788, 773, 151, 265

(56) References Cited

U.S. PATENT DOCUMENTS

| | | | | |
|---|---|---|---|---|
| 4,505,028 A | * | 3/1985 | Kobayashi et al. | 29/578 |
| 5,352,620 A | * | 10/1994 | Komori et al. | 437/52 |
| 5,814,526 A | * | 9/1998 | Tseng | 438/396 |
| 5,907,188 A | * | 5/1999 | Nakajima et al. | 257/751 |
| 6,037,273 A | * | 3/2000 | Gronet et al. | 438/773 |
| 6,197,702 B1 | * | 3/2001 | Tanabe et al. | 438/773 |

OTHER PUBLICATIONS

S. Wolf. Silicon Processing for the VLSI Era, vol. 2: Process Integration. Lattice Press, California, 1990. p. 598.*
S. Wolf, R. Tauber. Silicon Processing for the VLSI Era, vol. 1: Process Technology. Lattice Press, California, 1986. p. 198.*

* cited by examiner

Primary Examiner—Wael Fahmy
Assistant Examiner—Ginette Peralta
(74) Attorney, Agent, or Firm—Frederick J. Telecky, Jr.; W. James Brady, III

(57) ABSTRACT

An embodiment of the instant invention is a method of oxidizing a first feature (feature 108 and/or feature 104 of FIG. 1 and feature 314 of FIG. 3) while leaving a second feature substantially unoxidized (features 110 and 112 of FIG. 1 and features 310 and 312 of FIG. 3), the method comprised of subjecting the first and second features to an oxygen-containing gas and a separate hydrogen-containing gas. Preferably, the oxygen-containing gas is comprised of gas selected from the group consisting of $O_2$, $N_2O$, $CO_2$, $H_2O$, and any combination thereof, and the hydrogen-containing gas is comprised of $H_2$. The first feature is, preferably, comprised of polycrystalline silicon, silicon oxide, or a dielectric material, and the second feature is, preferably, comprised of tungsten.

26 Claims, 2 Drawing Sheets

SELECTIVE OXIDATION FOR SEMICONDUCTOR DEVICE FABRICATION

FIELD OF THE INVENTION

The instant invention pertains to semiconductor device fabrication and processing and more specifically to a method of oxidizing or reoxidizing a structure.

BACKGROUND OF THE INVENTION

As device dimensions continue to decrease to achieve higher density and performance, there is an increasing demand for highly conductive gate structures, interconnects, and electrodes for metal on silicon (MOS) devices. The polycrystalline silicon ("poly" or "polysilicon") used for these purposes in conventional processes has several limitations, due mainly to its higher resistivity.

Recently, various metal silicides have been considered because they have a conductivity which is higher than that of polysilicon by about an order of magnitude. However, future devices with very high integration densities will, most likely, need to be fabricated with higher conductivity materials for gate structures and interconnects. Therefore, either all metal structures will need to be formed or structures which are comprised of polysilicon and a refractory metal (such as tungsten, molybdenum, cobalt and/or titanium).

With regards to the formation of a gate structure, a thermal oxidation step is needed after the gate patterning, especially for memory devices. This oxidation step is needed to remove damage caused by the patterning and etching of the gate structure (primarily at the gate edges) by reactive ion etching (RIE) and to thicken the gate oxide on the edge so as to improve its reliability and reduce sharp corners at the lower edges of the conductive gate structure. If a polysilicon and tungsten gate structure is used, this oxidation step may create problems because tungsten easily oxidizes at temperatures greater than around 350 C in an oxygen ambient.

A solution to this problem involves using $H_2$ and $H_2O$ to oxidize any existing silicon or silicon oxide surfaces while leaving any tungsten surfaces unoxidized. See K. Nakajirna, et al., *Poly-metal Gate Process—Ultrthin WSiN Barrier Layer Impermeable to Oxidant In-diffusion during Si Selective Oxidation*, CONFERENCE PROCEEDINGS ULSI XI, 1996 MATERIALS RESEARCH SOCIETY 317–323 (1996). A problem with this approach is that a very small amount of water can be used and it is extremely difficult to controllably introduce such small amounts of water in large scale production of semiconductor devices.

SUMMARY OF THE INVENTION

In essence, the selective oxidation method of the instant invention involves the oxidation of one material ($M_1$) without substantially oxidizing another material ($M_2$). The chemical reactions for the oxidation of $M_1$ and $M_2$ are (using $O_2$ as the oxidizer):

$$2M_1 + O_2 \rightarrow 2M_1O + E_1 \quad (1)$$

$$2M_2 + O_2 \rightarrow 2M_2O + E_2 \quad (2)$$

where $E_1$ and $E_2$ are the enthalpies of formation for reactions (1) and (2), respectively. Preferably, in order to achieve the selective oxidation of the instant invention, a combination of an oxidizer (preferably $O_2$) and a reducer (preferably $H_2$) are utilized. The minimum requirement for the successful selective oxidation of $M_1$ while not appreciably oxidizing $M_2$ is that reaction (1) is favored as compared to reaction (2). In other words, $E_1$ is less than $E_2$. In the case where $M_1$ represents silicon, polycrystalline silicon, or amorphous silicon and $M_2$ represents tungsten,

$$Si + O_2 \rightarrow SiO_2 - 911 \text{ kJ/mol} \quad (3)$$

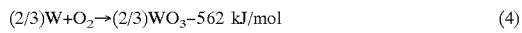
$$(2/3)W + O_2 \rightarrow (2/3)WO_3 - 562 \text{ kJ/mol} \quad (4)$$

Hence, since $E_1$ is less than $E_2$ (−911 kJ/mol versus −562 kJ/mol), the silicon of reaction (3) will oxidize much more readily than the tungsten of reaction (4).

An embodiment of the instant invention is a method of fabricating an electrical device formed in a semiconductor substrate, the method comprising: forming an insulating layer over the semiconductor substrate; forming a silicon-containing structure on the insulating layer; forming a conductive structure on the silicon-containing structure; and oxidizing a portion of the insulating layer and the silicon-containing structure while leaving the conductive structure substantially unoxidized by introducing an oxygen-containing gas and a separate hydrogen containing gas to the insulating layer, the silicon-containing structure and the conductive structure. The electrical device is, preferably, a memory device, a capacitor, a transistor, a logic device, a digital signal processor, a microprocessor, and any combination thereof. Preferably, the oxygen-containing gas is comprised of a gas selected from the group consisting of: $O_2$, $N_2O$, $CO_2$, $H_2O$, and any combination thereof, and the hydrogen-containing gas is comprised of $H_2$ or deuterium. The insulating layer is, preferably, comprised of silicon oxide; and the silicon-containing structure is comprised of a material consisting of single crystal silicon, doped polycrystalline silicon, undoped polycrystalline silicon, and amorphous silicon. Preferably, the conductive structure is comprised of an oxygen-sensitive material, and more preferably it is comprised of a material selected from the group consisting of: tungsten, copper, and any combination thereof.

Another embodiment of the instant invention is a method of oxidizing a first feature while leaving a second feature substantially unoxidized, the method comprised of subjecting the first and second features to an oxygen-containing gas and a separate hydrogen-containing gas. Preferably, the oxygen-containing gas is comprised of a gas selected from the group consisting of: $O_2$, $N_2O$, $CO_2$, $H_2O$, and any combination thereof, and the hydrogen-containing gas is comprised of $H_2$. The first feature is, preferably, comprised of polycrystailine silicon, silicon oxide, or a dielectric material, and the second feature is, preferably, comprised of tungsten.

Another embodiment of the instant invention is a method of fabricating a capacitor having a dielectric between a bottom electrode and a top electrode and situated over a semiconductor substrate, the method comprising the steps of: providing the bottom electrode over the semiconductor substrate; providing a dielectric material over the bottom electrode; and subjecting the bottom electrode and the dielectric material to an oxygen-containing gas and a separate hydrogen-containing gas, wherein the dielectric material is oxidized and the bottom electrode remains substantially unoxidized. Preferably, the oxygen-containing gas is comprised of a gas selected from the group consisting of: $O_2$, $N_2O$, $CO_2$, $H_2O$, and any combination thereof, and the hydrogen-containing gas is comprised of $H_2$. The dielectric material is, preferably, comprised of a material selected from the group consisting of: an oxide/nitride stack, BST, tantalum pentoxide, PZT, and any combination thereof.

DETAILED DESCRIPTION OF THE DRAWINGS

Basically, the instant invention involves a method of oxidizing selective materials such as silicon (single crystal, polycrystalline, or amorphous silicon) without appreciably oxidizing any other materials (such as a tungsten or tungsten nitride structure). In one embodiment of the instant invention the oxidation is performed by introducing hydrogen gas and oxygen gas into a chamber where the semiconductor wafer resides and heating the wafer and/or the chamber. Note, however, that the introduction of hydrogen gas along with oxygen gas can be very volatile.

In order to safely oxidize the desired structure while leaving other structures (preferably the refractory metals) unoxidized using oxygen and hydrogen gases, the system pressure should not exceed its safety limit in the presence of the following reaction

$$2H_2 + O_2 \rightarrow 2\ H_2O + E \qquad (5)$$

where E is the enthalpy generated by this reaction.

If the system/chamber is first filled with $H_2$ and $O_2$ before reaction (5) takes place, then the final pressure of the system is given by:

$$P = P_0 * [1 + (T/T_0)] \qquad (1)$$

where $T = E/$(heat capacitance of the resulting gas system), $P$ is the ending pressure, $P_0$ is the staring pressure of the system, $T_0$ is the starting temperature, and the heat capacitance is a function of the $O_2$ to $H_2$ ratio (and assuming it is independent of the temperature). For example, starting at 500 C with a constant volume mix of $O_2$ in $H_2$ (ratio of 1:10) and an initial pressure of 200 Torr, the final pressure of the system (using equation (1)) is about 600 Torr which is less than the pressure of the atmosphere. Therefore, this process should be safe.

If reaction (5) occurs as $H_2$ and $O_2$ are entered into the system, then the reaction occurs in only part of the volume of the chamber. By doing this, the safety of the process is improved and the process window can be enlarged because the reaction occurs in only a portion of the total volume of the process chamber thereby leaving the rest of the volume available for expansion. In this case, reaction (5) occurs continuously as the gases enter into the chamber instead of filling the entire chamber with the gases before ignition of the gases.

A variation of this approach is to start the reaction at a lower pressure and increase the pressure once the reaction starts. Another variation involves starting the reaction at a lower concentration of one gas (such as $O_2$) and increasing the concentration once the reaction starts.

Figure 1:
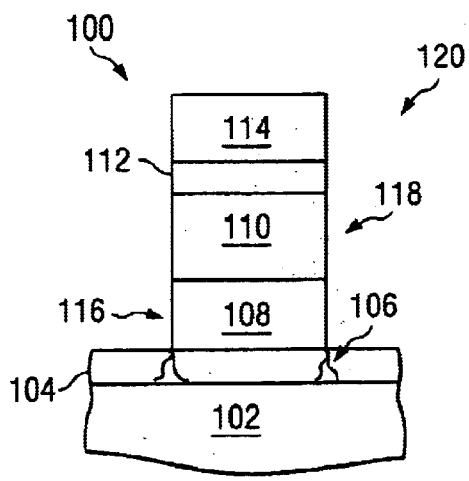
FIG. 1 is cross-sectional view of a device formed using the method of an embodiment of the instant invention.
Figure 2:
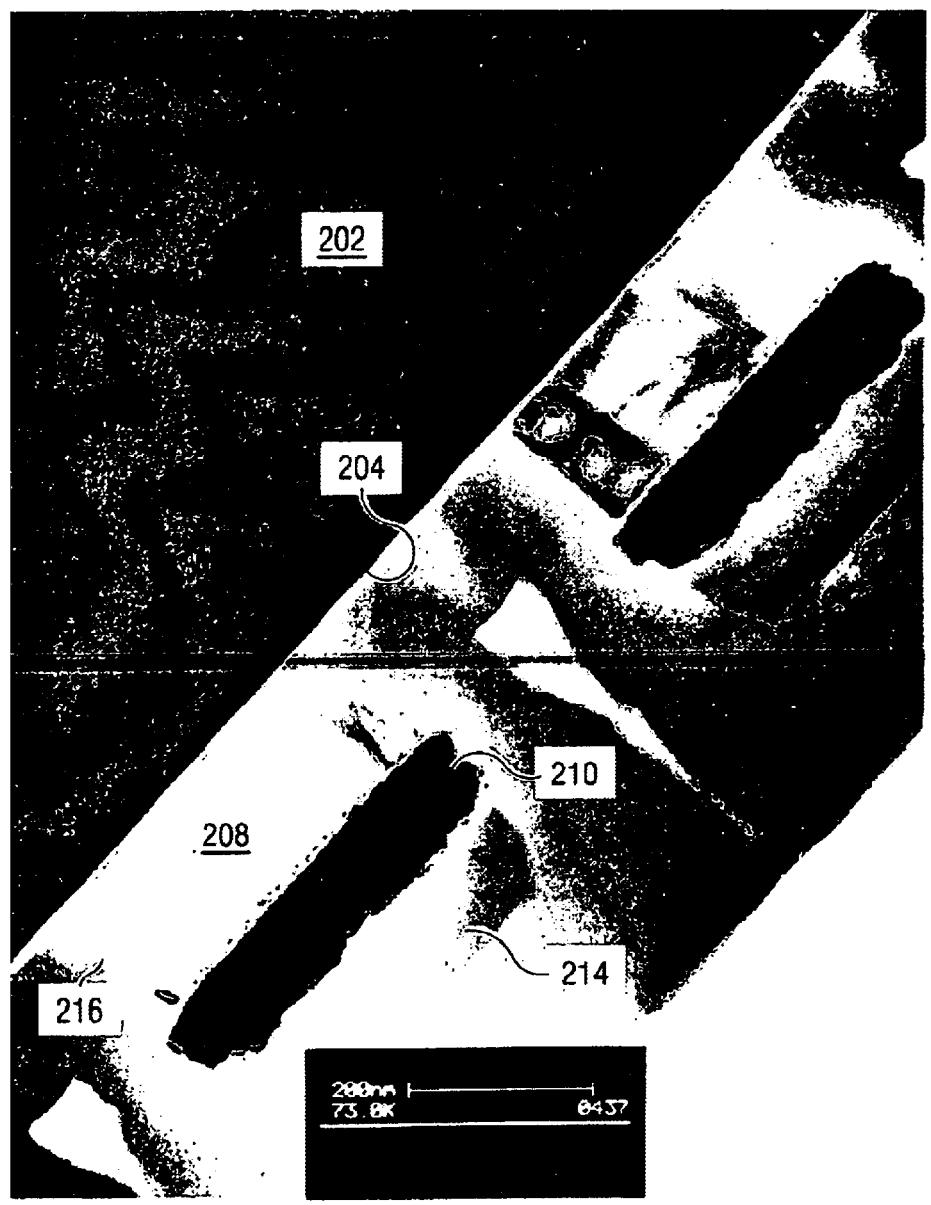
FIG. 2 is a TEM photograph of devices formed using the method of the instant invention. The photograph of FIG. 2 illustrates the same devices as those of FIG. 1.

FIGS. 1 and 2 illustrate a transistor formed using the method of the instant invention. After gate insulating layer 104 (preferably an oxide layer—more preferably $SiO_2$) is formed, a semiconductive layer (preferably insitu doped, exsitu doped, or undoped polysilicon) is formed (preferably deposited by chemical vapor deposition). Next, a metal layer is formed (preferably deposited). Preferably, the metal layer is comprised of a refractory metal (preferably tungsten, cobalt, aluminum, or titanium) formed over a nitride layer (preferably comprised of the refractory metal and nitrogen—more preferably tungsten nitride). This is followed by the formation of a nitride layer (preferably comprised of silicon and nitride—more preferably $Si_4N_3$).

Next, these layers are etched to form gate structure 120 (preferably comprised of polysilicon structure 108, tungsten nitride structure 110, tungsten structure 112, and silicon nitride structure 114). Preferably, this etch step is performed by reactive ion etch (RIE) but it can be accomplished using any standard processing step. One drawback to this etch step, especially when RIE is used, is that it may degrade the gate dielectric at locations 106. If left untreated, this may increase the leakage of the device or may lower the gate oxide integrity (GOI) thereby rendering the device nonfunctional or damaged. Using conventional oxidation methods, the damaged portions of gate insulating layer 104 are reoxidized along with the oxidation of surfaces 116 of polysilicon structure 108 and surfaces 118 of metal structure 110 and 112. In fact, it may even entirely oxidize metal structures 110 and 112. This will severely degrade the device because the conductivity of the resulting structure (including layers 110 and 112) may greatly decrease due to the oxidation of the metal (especially where the metal is tungsten). Oxidation of metal structures 110 and 112 may also cause peeling. The method of the instant invention allows for the reoxidation of layer 104 and the oxidation of silicon-containing structure 108 while leaving metal structure 112 (preferably comprised of W, Ti, Co, Cu, or Al) and metal-nitride structure 110 (preferably comprised of a nitride and a refractory metal such as W, Ti, Co, Cu, or Al—more preferably tungsten nitride) substantially unoxidized. This is shown in FIG. 2 where region 208 is equivalent to region 108, region 210 is equivalent to regions 110 and 112, region 214 is equivalent to region 114 and region 216 illustrates the formed oxide regions on the side of region 208.

In a preferred embodiment of the instant invention, this oxidation step is accomplished by providing around 12% $O_2$ and $H_2$ into a chamber in which the wafer is provided. The pressure within the chamber is preferably around 100 Torr and the temperature is around 1000 C. Using this embodiment for around 60 to 80 seconds (preferably 70 seconds) will result in around 3 nm of oxide to be formed on bare silicon and thin silicon oxide, and it will result in around 6 to 10 nm of oxide to be grown on polysilicon structures. While these specific conditions are preferred, the temperature, pressure, time, and amount of oxygen versus that of hydrogen can be changed so as to grow more or less of an oxide film so long as oxidation of the silicon or silicon oxide structure is accomplished while not substantially oxidizing the metal or metal nitride structures.

Preferably, this embodiment of the instant invention may be implemented to selectively oxidize silicon structures in the presence of tungsten under the following conditions: the ambient temperature is between 300 and 1200 C; the pressure is around 1 Torr to 10 atmospheric pressure; the oxidizer to reducer ration (for example, $O_2$ to $H_2$ ratio, respectively) is around 0.1% to 99.9%; and the duration is around 1 second to 10 hours.

In another embodiment of the instant invention, the mixture of hydrogen and oxygen (or $N_2O$ and $H_2$, $N_2O$, $H_2$ and $N_2$, $H_2O$ and $H_2$, or $CO_2$ and $H_2$) can be used to selectively oxide a particular material (such as $Ta_2O_5$ or BST) without oxidizing other material; which are present (such as copper, tungsten, platinum, or other refractory metal or conductive structure which may be used to make an electrode of a memory cell) in developing electronic devices (such as the memory cell of a DRAM). The selective oxidation method of this embodiment of the instant invention car be accomplished by using an $O_2$ and $H_2$ ambient to oxidize a capacitor dielectric. While this embodiment is preferably performed as a rapid thermal process step with relatively low ambient pressures, it can be implemented in many ways. An advantage of this method is that it may be implemented using a lower thermal budget (preferably, the temperatures required will be around 400 to 1000 C) and it can be used so as to oxidize the capacitor dielectric while leaving other features (such as tungsten, platinum, copper, or other similar materials) substantially unoxidized.

Preferably, this embodiment of the instant invention may be implemented under the following conditions: the ambient temperature is between 300 and 1200 C; the pressure is around 1 Torr to 10 atmospheric pressure; the oxidizer to reducer ration (for example, $O_2$ to $H_2$ ratio, respectively) is around 0.1% to 99.9%; and the duration is around 1 second to 10 hours.

Figure 3:
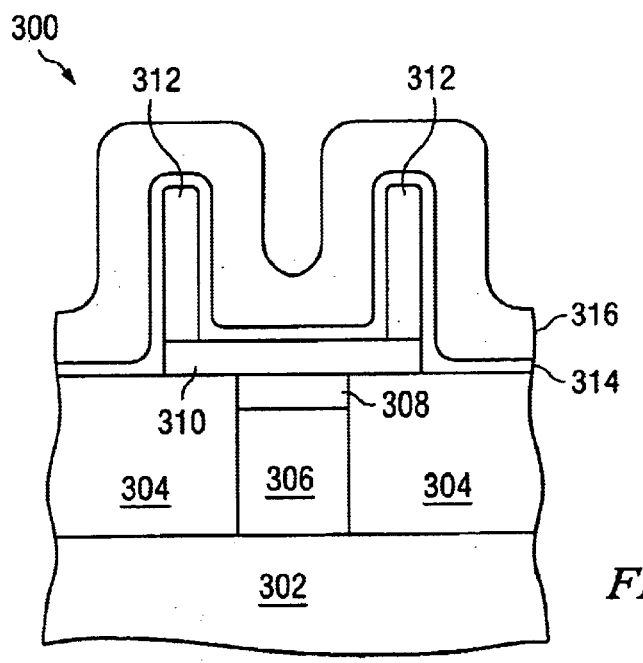
FIG. 3 is a cross-sectional view of a memory cell formed using the method of another embodiment of the instant invention.

FIG. 3 illustrates a memory cell which is fabricated using the method of the instant invention. The memory cell of the instant invention can be formed either over or under the bitline, and it may either be formed as a "crown cell" or as a planar cell and it may or may not be formed of rugged polysilicon or hemispherical grain polysilicon. The memory cell of FIG. 3 is comprised of substrate 302, interlevel dielectric 304, conductive plug 306 (preferably comprised of doped single-crystal or polycrystaline silicon), bottom electrode base 310 and upright portions 312, dielectric layer 314 and top electrode 316. Basically, the method of the instant invention can be used to either form dielectric 314 and/or to prevent the oxidation of bottom electrode 310 and 312. More specifically, if conductive plug 306 and electrode 310 and 312 are formed of tungsten and if the dielectric material requires a high temperature anneal in an oxygen containing ambient (such as $Ta_2O5$ and BST require), then the instant invention may be utilized to prevent the oxidation of these features. Preferably, this is accomplished using the following conditions: the ambient temperature is between 300 and 1200 C; the pressure is around 1 Torr to 10 atmospheric pressure; the oxidizer to reducer ration (for example, $O_2$ to $H_2$ ratio, respectively) is around 0.1% to 99.9%; and the duration is around 1 second to 10 hours.

In another embodiment, the instant invention can be used to form the capacitor dielectric 314 or to reoxidize capacitor dielectric so to enhance it properties. Preferably, dielectric 314 is formed or reoxidized by subjecting the wafer to a mixture of $H_2$ and $O_2$ or $H_2$ and $N_2O$. Preferably, this is accomplished using the following conditions: the ambient temperature is between 300 and 1200 C; the pressure is around 1 Torr to 10 atmospheric pressure; the oxidizer to reducer ration (for example, $O_2$ to $H_2$ ratio, respectively) is around 0.1% to 99.9%; and the duration is around 1 second to 10 hours.

Figure 4:
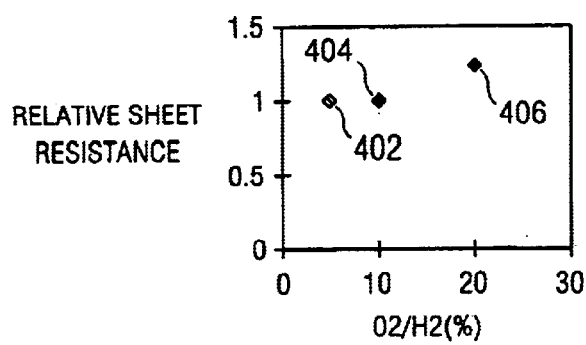
FIG. 4 is a graph illustrating relative sheet resistivity of a tungsten layer subjected to the oxidation step of the instant invention.

FIG. 4 is a graph illustrating relative sheet resistivity of a tungsten layer which is approximately 60 nm thick and is subjected to the oxidation step of the instant invention versus the percentage of $O_2/H_2$ mixture. The pressure is around 100 Torr at around 1000 C. Points 402 and 404 illustrate that the sheet resistivity of a tungsten layer subjected to an oxidation step of the instant invention, where the $O_2/H_2$ mixture is 10% or less, has the same sheet resistivity as a tungsten layer which has not been subjected to an oxidation step. Point 406 illustrates that the sheet resistivity of a tungsten layer subjected to an oxidation step of the instant invention, where the ($O_2/H_2$ mixture is around 20%, has a sheet resistivity around 20% higher than that of an untreated tungsten layer.

While the instant invention has been described with regards to an oxidizing agent which is a mixture of $O_2$ and $H_2$, many different oxidizing agents can be used so long as they oxidize selective materials such as silicon while not appreciably oxidizing other materials such as refractory metals and their corresponding nitrides (such as tungsten and tungsten nitride). For example, $N_2O$ and $H_2$ could be used or any of the following NO and $H_2$; or $O_2$ and CO. More specifically, it should be a combination of an oxidizer and a reducer.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating, in a semiconductor processing chamber, an electrical device formed in a semiconductor substrate, said method comprising:

forming an insulating layer over said semiconductor substrate;

forming a silicon-containing structure on said insulating layer;

forming a conductive structure on said silicon-containing structure; and oxidizing a portion of said insulating layer and said silicon-containing structure while leaving said conductive structure substantially unoxidized by introducing $O_2$ and $H_2$ in the semiconductor processing chamber in an explosive reaction, such that the reaction between said $O_2$ and $H_2$ does not increase the pressure in the processing chamber beyond a predetermined safe level.

2. The method of claim 1, wherein said electrical device is selected from the group consisting of; a memory device, a capacitor, a transistor, a logic device, a digital signal processor, a microprocessor, and any combination thereof.

3. The method of claim 1, wherein said insulating layer is comprised of silicon oxide.

4. The method of claim 1, wherein said silicon containing structure is comprised of a material consisting of single crystal silicon, doped polycrystalline silicon, undoped polycrystalline silicon, and amorphous silicon.

5. The method of claim 1, wherein said conductive structure is comprised of an oxygen-sensitive material.

6. The method of claim 1, wherein said conductive structure is comprised of a material selected from the group consisting of: tungsten, copper, and any combination thereof.

7. The method of claim 1 wherein said oxidizing step comprises the step of oxidizing a portion of said insulating layer and said silicon-containing structure while leaving said conductive structure substantially unoxidized by introducing $O_2$ and $H_2$ in an explosive reaction in a portion of a process chamber's total volume, such that reaction between the $O_2$ and $H_2$ occurs continuously as the $O_2$ and $H_2$ enter the chamber.

8. The method of claim 1 wherein said oxidizing step comprises the step of oxidizing a portion of said insulating layer and said silicon-containing structure while leaving said conductive structure substantially unoxidized by introducing $O_2$ and $H_2$ in a predetermined ratio and increasing the concentration of one of said $O_2$ or $H_2$ after a reaction begins.

9. The method of claim 1 wherein said oxidizing step comprises the step of oxidizing a portion of said insulating layer and said silicon-containing structure while leaving said conductive structure substantially unoxidized by introducing $O_2$ and $H_2$ while the chamber is at a low pressure and increasing the pressure once the reaction begins.

10. A method of oxidizing, in a semiconductor processing chamber, a first feature while leaving a second feature substantially unoxidized, said method comprised of subjecting said first and second features to $O_2$ and $H_2$ in an explosive reaction in said semiconductor processing chamber, such that the reaction between said $O_2$ and $H_2$ does not increase the pressure in the processing chamber beyond a predetermined safe level.

11. The method of claim 10, wherein said first feature is comprised of polycrystalline silicon.

12. The method of claim 10, wherein said first feature is comprised of silicon oxide.

13. The method of claim 10, wherein said first feature is comprised of a dielectric material.

14. The method of claim 10, wherein said second feature is comprised of tungsten.

15. The method of claim 10 and further comprising the step of introducing $O_2$ and $H_2$ in an explosive reaction in a portion of a process chamber's total volume, such that reaction between the $O_2$ and $H_2$ occurs continuously as the $O_2$ and $H_2$ enter the chamber.

16. The method of claim 10 and further comprising the step of introducing $O_2$ and $H_2$ in a predetermined ratio and increasing the concentration of one of said $O_2$ or $H_2$ after a reaction begins.

17. The method of claim 10 and further comprising the step of introducing $O_2$ and $H_2$ while the chamber is at a low pressure and increasing the pressure once the reaction begins.

18. A method of fabricating, in a semiconductor processing chamber, a capacitor having a dielectric between a bottom electrode and a top electrode and situated over a semiconductor substrate, said method comprising the steps of:

providing said bottom electrode over said semiconductor substrate;

providing a dielectric material over said bottom electrode; and subjecting said bottom electrode and said dielectric material to an explosive reaction between $O_2$ and $H_2$ in semiconductor processing chamber, wherein said dielectric material is oxidized and said bottom electrode remains substantially unoxidized, such that the reaction between said $O_2$ and $H_2$ does not increase the pressure in the processing chamber beyond a predetermined safe level.

19. The method of claim 18, wherein said dielectric material is comprised of a material selected from the group consisting of: and oxide/nitride stack, BST, tantalum pentoxide, PZT, and any combination thereof.

20. The method of claim 18 and further comprising the step of introducing $O_2$ and $H_2$ in an explosive reaction in a portion of a process chamber's total volume, such that reaction between the $O_2$ and $H_2$ occurs continuously as the $O_2$ and $H_2$ enter the chamber.

21. The method of claim 18 and further comprising the step of introducing $O_2$ and $H_2$ in a predetermined ratio and increasing the concentration of one of said $O_2$ or $H_2$ after a reaction begins.

22. The method of claim 18 and further comprising the step of introducing $O_2$ and $H_2$ while the chamber is at a low pressure and increasing the pressure once the reaction begins.

23. A method of fabricating an electrical device formed in a semiconductor substrate, said method comprising:

forming an insulating layer over said semiconductor substrate;

forming a silicon-containing structure on said insulating layer;

forming a conductive structure an said silicon-containing structure; and oxidizing a portion of said insulating layer and said silicon-containing structure while leaving said conductive structure substantially unoxdized by introducing an oxygen-containing gas selected from the group consisting of $O_2$, $N_2O$, NO or $CO_2$ and a separate hydrogen containing gas in a semiconductor processing chamber housing said insulating layer, said silicon-containing structure and said conductive structure, such that an explosive reaction between said the hydrogen-containing gas and the oxygen containing gas does not increase the pressure in the processing chamber beyond a predetermined safe level.

24. The method of claim 23 wherein said oxidizing step comprises the step of oxidizing a portion of said insulating layer and said silicon-containing structure while leaving said conductive structure substantially unoxidized by introducing said oxygen-containing gas and said hydrogen containing gas in a portion of a process chamber's total volume, such that an explosive reaction between the the hydrogen-containing gas and the oxygen containing gas occurs continuously as the the hydrogen-containing gas and the oxygen containing gas enter the chamber.

25. The method of claim 23 wherein said oxidizing step comprises the step of oxidizing a portion of said insulating layer and said silicon-containing structure while leaving said conductive structure substantially unoxidized by introducing oxygen-containing gas and said hydrogen containing gas in a first predetermined ratio and increasing the concentration of one of said oxygen-containing gas or said hydrogen containing gas after a reaction begins.

26. The method of claim 23 wherein said oxidizing step comprises the step of oxidizing a portion of said insulating layer and said silicon-containing structure while leaving said conductive structure substantially unoxidized by introducing said oxygen-containing gas and said hydrogen containing gas while the chamber is at a low pressure and increasing the pressure once the reaction begins.

* * * * *